United States Patent [19]

Bobbio et al.

[11] Patent Number: 4,465,552
[45] Date of Patent: Aug. 14, 1984

[54] METHOD OF SELECTIVELY ETCHING SILICON DIOXIDE WITH $SF_6$/NITRIDING COMPONENT GAS

[75] Inventors: Stephen M. Bobbio, Hamburg; Marie C. Flanigan, Lockport; Kenneth M. Thrun, Cheektowaga, all of N.Y.

[73] Assignee: Allied Corporation, Morris Township, Morris County, N.J.

[21] Appl. No.: 522,437

[22] Filed: Aug. 11, 1983

[51] Int. Cl.³ .................. H01L 21/306; B44C 1/22; C03C 15/00; C03C 25/06
[52] U.S. Cl. .................................... 156/643; 156/646; 156/653; 156/657; 156/659.1; 204/192 E; 252/79.1
[58] Field of Search .............. 156/643, 646, 653, 657, 156/659.1, 345; 252/79.1; 204/164, 192 E, 298; 427/38, 39

[56] References Cited

U.S. PATENT DOCUMENTS 4,330,384  5/1982  Okudaira et al. ............. 156/643 X Primary Examiner—William A. Powell
Attorney, Agent, or Firm—Arthur J. Plantamura; Jay P. Friedenson

[57] ABSTRACT

A gaseous mixture of $SF_6$ and a nitriding component such as $NH_3$ is disclosed as an effective selective $SiO_2$ etchant for use in either the plasma or reactive ion etch process. By adding $NH_3$ to the $SF_6$, which is a known effective plasma etchant for silicon or poly-silicon, the silicon etch rate decreases while the oxide rate is effectively constant. At about 14% nitriding gas component, the rates are equivalent and for higher nitriding gas fractions, the silicon dioxide rate dominates. The optional addition of an inert diluent gas did not substantially change these results. The addition of hydrogen to the gaseous $SF_6$/nitriding component mixture retards the etch rate on silicon still further and may increase the selectivity.

11 Claims, 1 Drawing Figure

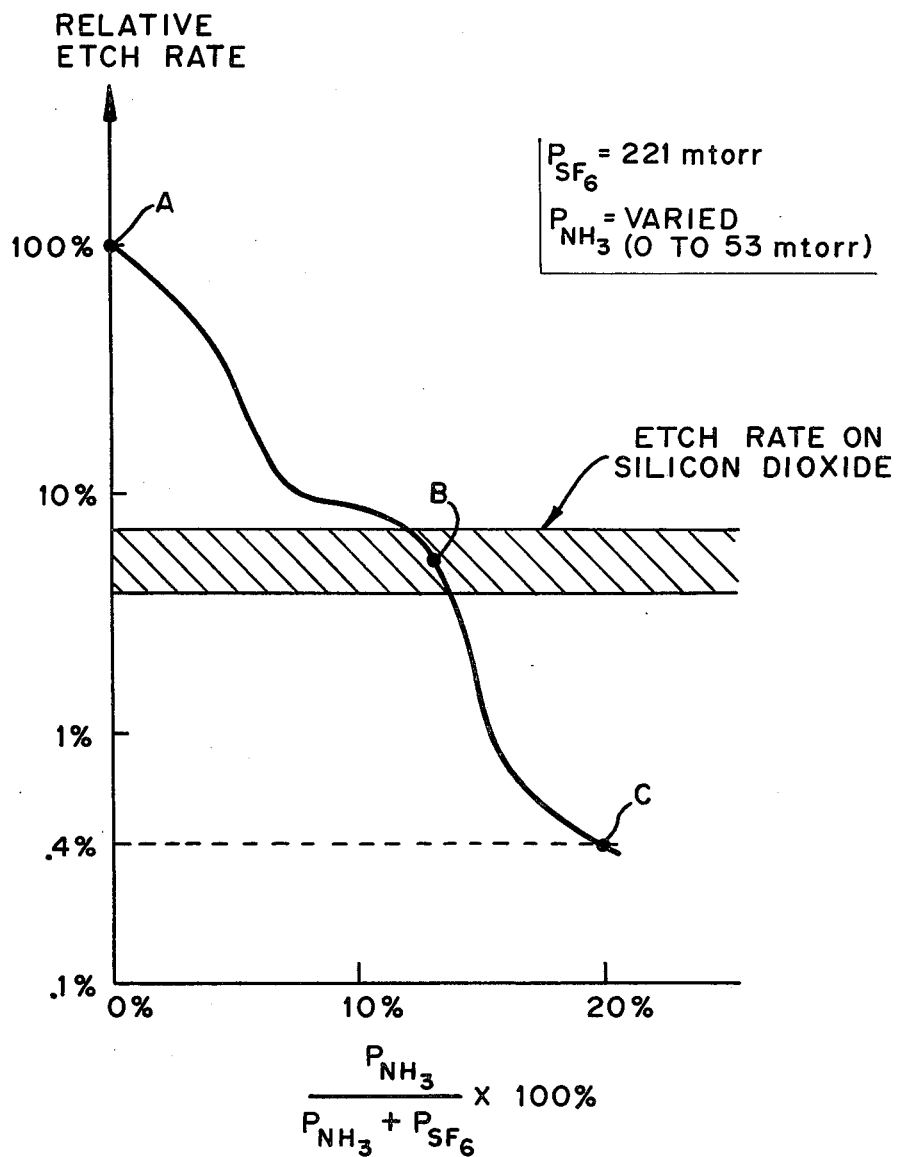

METHOD OF SELECTIVELY ETCHING SILICON DIOXIDE WITH SF$_6$/NITRIDING COMPONENT GAS

BACKGROUND OF THE INVENTION

This invention relates to plasma etching or reactive ion etching. More particularly, the invention relates to an improved etchant mixture which does not substantially affect the etch rate on SiO$_2$ but significantly decreases the etch rate on silicon.

An important step in the manufacture of semiconductor chips and thin film circuitry is the etching of the different layers such as polysilicon and silicon dioxide which make up the finished semiconductor chip or the thin film circuit. In the manufacture of these thin film circuits, one method of etching has been to overlay the surface to be etched with a suitable mask and to immerse the circuit so masked in a chemical solution which attacks the surface to be etched while leaving the mask otherwise intact. It has been difficult with the chemical etching processes presently known to achieve well-defined edges on the etched surfaces. The difficulty arises because the chemical action tends to etch isotropically, i.e., it undercuts the mask by the same distance that it penetrates the underlayer, and thus enlarges the feature. It is, therefore, very difficult to use wet chemical etching to achieve fine structures; fine structures being defined as structures having geometries on the order of one micron.

One known method for manufacturing semiconductor chips is called "plasma etching" in which a vacuum container is filled with a low pressure gas such as a fluorocarbon or SF$_6$. A surface to be etched is covered by a mask and inserted into the container along with the reactive gas. To etch the surface, an ac voltage whose frequency may be between 20 kHz and 30 Ghz is applied to excite the fluorocarbon or SF$_6$, thereby dissociating the fluorocarbon or SF$_6$ and forming various positive and negative ions, reactive neutral species (e.g., F atoms), and electrons. The dissociated species interact with the surface to be etched producing various gases as reaction products.

The ability to etch thin (approximately 1$\mu$) layers of SiO$_2$ over Si is an important aspect of the plasma or reactive ion etch processes used in microcircuit manufacture. The plasma field of any given apparatus or oxide layer thickness is not necessarily uniform over the entire wafer surface, thus the etch may penetrate the SiO$_2$ layer at different times. In order to avoid etching the underlying silicon underlayer where the oxide has first cleared, it is desirable to arrange a selective plasma process which does not seriously affect or diminish the etch rate on SiO$_2$ but significantly decreases the rate on silicon.

Considerable prior art exists describing plasma etching wherein various plasma generating compositions, such as CF$_4$, CHF$_3$, C$_2$F$_6$, C$_2$F$_4$, CCl$_4$, BCl$_3$, etc., including admixtures, with O$_2$, N$_2$, Ar or air, are introduced into a reactor under a specific pressure to generate a plasma within the reactor. The material to be etched is introduced into the reactor and the etching process is effected by radicals formed by the plasma. In the past, such compositions have not yielded consistently satisfactory results. Additionally, the use of SF$_6$ alone or in mixtures with chlorine gas have been employed in selectively etching silicone or polysilicon over silicon dioxide, or where silicon dioxide is used as a mask, as disclosed for example, in U.S. Pat. Nos. 4,052,251, 4,214,946 and 4,330,384. The patentees in U.S. Pat. No. 4,330,384 in column 3, especially at lines 38–41, for example, emphasize this selectivity of SF$_6$ for silicon over SiO$_2$. No prior art is known, however, in which the reverse is disclosed, i.e., which describes the use of SF$_6$ for the selective etching of silicon dioxide preferentially over the underlying silicon.

Accordingly, a need exists for a composition that avoids the drawbacks of the prior art especially a mixture which is efficient, yet does not substantially attack the underlying silicon during the etching process.

SUMMARY OF THE INVENTION

In accordance with the invention, it has been found that a gaseous mixture of SF$_6$ and a nitrogen containing compound that is effective in nitriding the silicon surface is a very effective SiO$_2$ etchant for use in either the plasma or reactive ion etch processes. A preferred nitriding compound is NH$_3$. However, one or more of various nitrogen compounds when admixed with the SF$_6$ in the gas mixture has the effect of nitriding the silicon surface and etching the silicon dioxide surface. Optionally, the mixture may contain an inert diluent gas such as argon, helium, neon, krypton or xenon, etc.

It has been discovered in accordance with the invention, that the undesirable etching of silicon is substantially reduced by the addition of a nitriding component such as NH$_3$ or another suitable nitriding compound or mixtures of nitriding compounds to the SF$_6$ plasma gas mixture. By adding the nitriding component to the SF$_6$, it has been found that the etch rate on the silicon can be decreased substantially while the oxide rate is effectively constant. For example, with the inclusion in the mixture of about 14% NH$_3$, for a given excitation level, pressure, etc., the etch rates of oxide and silicon are equivalent, and for higher NH$_3$ fractions the etch rate of oxide dominates over silicon. Additionally, with the inclusion of hydrogen with the NH$_3$ or other nitriding compound in the SF$_6$ plasma composition, an even more pronounced decrease in silicon etch rate is obtainable. Any deposition encountered during the course of the etching operation is readily obviated by heating the environment contiguous to the plasma etching apparatus. The addition of a diluent gas to the SF$_6$ gas mixture did not substantially change these results. The addition of hydrogen to the SF$_6$ gas mixture does, however, decrease the etch rate on silicon and can improve selectivity.

BRIEF DESCRIPTION OF THE DRAWING

The etch rates on silicon and silicon dioxide were monitored by following the SiF$_4$ product peak on a mass spectrometer.

The drawing shows the decrease in the silicon etch rate with the addition of NH$_3$ as the nitriding component. At a level beginning at about 14% NH$_3$, the etch rates on silicon and on silicon dioxide become equivalent. As more ammonia is added, the etch rate on silicon dioxide begins to dominate until at about 20% NH$_3$, the selectivity for preferentially etching silicon dioxide against silicon is about 12:1.

DESCRIPTION OF THE PREFERRED EMBODIMENTS

In accordance with the illustrated preferred embodiment, the present invention provides an improved composition for etching thin film circuits or semiconductor chips which is capable of producing extremely well defined edges on etched materials while at the same time achieving rapid etching rates. The method permits the preferential etching of silicon dioxide over silicon or polysilicon in articles containing a layer of silicon dioxide on an underlayer of silicon or polysilicon in the manufacturing process. Specifically, the selective etching is effected by exposing the article to a plasma gas discharge wherein the plasma composition comprises $SF_6$ in combination with a nitriding component, i.e., a substance which furnishes a nitriding compound in the gaseous phase. Moreover, it has been found that the addition of hydrogen to the $SF_6$/nitriding gas plasma composition further enhances the decrease in the etch rate on the silicon or polysilicon.

In the etching process, the $SF_6/NH_3$ composition is placed in a container along with the exciting electrode and a grounded electrode. The silicon dioxide surface to be etched is covered by a suitable mask and the substrate mounted on one of the electrodes, e.g., on the powered electrode, which may become negatively biased relative to ground once the plasma is established (reactive ion mode) or on the grounded electrode in the plasma mode. The electric field established in the region between the electrodes accelerates free electrons which then serve to dissociate the gas forming a plasma which is positive relative to its surroundings. The silicon dioxide surface is etched by both chemical interaction with various active species and by energy and momentum transfer of positive ions impinging on the surface. The ions impinging on the silicon dioxide surface arrive predominantly in a direction perpendicular to that surface so that the process produces well defined vertically etched sidewalls. The use of a nitriding component, such as ammonia, and the $SF_6$ gas allows the silicon dioxide to be selectively and anisotropically etched against a silicon or polysilicon underlayer.

As shown by reference to the drawing in which the amount of $NH_3$ added is expressed on the abscissa as a percentage of the total pressure, pure $SF_6$ is a very effective selective plasma etchant for silicon. This phenomenon is shown at the left in the FIGURE of the drawing, point "A", where the silicon dioxide etch rate is about 5 to 7 percent of that on silicon. At higher pressures of $SF_6$, selectivities of 50:1 of Si over $SiO_2$ have been observed. This is a useful property. The discovery of the present invention however, resides in reversing the selectivity of silicon relative to silicon dioxide. As $NH_3$ or other nitriding component is added to the $SF_6$ plasma gas, as depicted in the drawing, the silicon etch rate decreases (as shown by the curve) while the etch rate on silicon dioxide, as indicated by the shaded region, is effectively constant. At about 14% $NH_3$, point "B", the etch rates of silicon and silicon dioxide are equivalent and for higher $NH_3$ fractions, the etch rate for silicon dioxide dominates until at about 20% $NH_3$ content, point "C", a selectivity of about 12:1 $SiO_2$ over silicon is achieved.

Generally the ratio of partial pressures of the gaseous components, i.e., of $SF_6$ to nitriding gas, e.g., $NH_3$, is on the order of about 17:3 to about 1:2. The actual ratio is dependent on a number of prevailing parameters (e.g. reactor geometry, level of excitation, electrode spacing, etc.). It has been discovered further that there may be a marked decrease, of the order of about five-fold or greater, in the etch rate on silicon or polysilicon when hydrogen is added to the $SF_6$/nitriding component gas composition. Generally, the partial pressure ratio of hydrogen to nitriding gas mixture is in the order of at least 10%. Generally, in practice, hydrogen is added in a relative proportion to the nitriding gas of about 7:3 to about 1:2, and preferably in a proportion of about 2:1. In the $SF_6$:$NH_3$:$H_2$ system, the partial pressure ratio respectively may range in the order of from about 17:3:6 to about 1:2:2, for example. Argon or other inert diluent gas such as helium, etc. of up to about 80 percent or more may be added to the plasma mixture and does not substantially change the advantageous preferential etching of the $SiO_2$ over the silicon or polysilicon underlayer.

The addition of hydrogen to an $SF_6$/nitriding component mixture in contrast to an inert diluent does, however, significantly decrease the etch rate on silicon. The addition of hydrogen can, therefore, improve the $SiO_2$:-silicon selectivity.

Any deposition of decomposition products tending to occur during the course of the etching process, as is often encountered with fluorocarbon processes should be avoided and may be eliminated by heating the reaction chamber, such as by wrapping a heating jacket or thermal tape around the plasma reactor. A minimum temperature of about 50° C. may be used. (This minimum temperature will vary somewhat depending on actual gas composition and power level used and other prevailing conditions.) The maximum temperature is limited by the photoresist mask and a temperature of 125° C. or below is usually necessary to avoid photoresist degradation.

While the invention has been particularly shown and described with reference to the preferred embodiments thereof, it will be understood by those skilled in the art that various changes in form and detail may be made therein without departing from the spirit and scope of the invention.

What is claimed is:

1. A method of selectively etching silicon dioxide preferentially over silicon or polysilicon in an article containing a layer of silicon dioxide on an underlayer of silicon or polysilicon which comprises exposing said article to a low pressure plasma gas mixture discharge wherein the plasma comprises $SF_6$ and a nitriding component in the gaseous phase and continuing said exposure until the silicon dioxide layer is penetrated.

2. The method of claim 1 wherein the nitriding component is ammonia.

3. The method of claim 1 wherein hydrogen is added to the plasma gas.

4. The method of claim 2 wherein hydrogen is added to the plasma gas.

5. The plasma etching method as recited in claim 1 wherein silicon dioxide is etched selectively against silicon further characterized in that the ratio of $SF_6$ to $NH_3$ is respectively about 17:3 to about 1:2.

6. The method of claim 1 in which the gas mixture is diluted with an inert gas.

7. The method of claim 6 wherein the inert gas is selected from the group consisting of argon and helium.

8. The method of claim 1 wherein the plasma gas mixture incorporates hydrogen in a proportion by partial pressures to the nitriding component of from about 7:3 to about 1:2.

9. The method of claim 8 wherein the nitriding component is ammonia and the proportion by partial pressure to hydrogen is 3:7 to 2:1.

10. A plasma etch gas for selectively etching silicon dioxide against silicon comprising a mixture of at least about 14 percent by partial pressure $NH_3$ in $SF_6$.

11. A plasma etch gas according to claim 10 containing hydrogen in a proportion by partial pressure to the nitrogen-containing compound from about 7:3 to about 1:2.

* * * * *